United States Patent [19]
Giannatto et al.

[11] Patent Number: 5,825,621
[45] Date of Patent: Oct. 20, 1998

[54] CLOSED LOOP COOLING HOUSING FOR PRINTED CIRCUIT CARD-MOUNTED, SEALED HEAT EXCHANGER

[75] Inventors: Carl J. Giannatto, Melbourne; Kevin C. Cornish, Palm Bay, both of Fla.

[73] Assignee: Harris Corporation, Melbourne, Fla.

[21] Appl. No.: 916,470

[22] Filed: Aug. 22, 1997

Related U.S. Application Data

[63] Continuation-in-part of Ser. No. 873,677, Jun. 12, 1997.

[51] Int. Cl.⁶ ............................................ H05K 7/20
[52] U.S. Cl. .................. 361/701; 165/80.3; 165/104.33; 361/719
[58] Field of Search ...................... 165/139, 149, 165/80.3, 122, 185, 104.33, 80.4, 80.5; 257/706, 707, 712, 713, 722; 62/259.2; 174/16.1, 16.3; 361/692–695, 699, 796, 831, 701–704, 707–711, 715–719, 720–722

[56] References Cited

U.S. PATENT DOCUMENTS

| | | | |
|---|---|---|---|
| 4,006,388 | 2/1977 | Bartholomew | 361/696 |
| 4,009,423 | 2/1977 | Wilson | 361/385 |
| 4,807,441 | 2/1989 | Agee | 62/3 |
| 4,958,257 | 9/1990 | Wenke | 361/385 |
| 5,079,619 | 1/1992 | Davidson | 357/81 |
| 5,183,104 | 2/1993 | Novotny | 165/104.33 |
| 5,276,584 | 1/1994 | Collins et al. | 361/718 |
| 5,412,536 | 5/1995 | Anderson et al. | 361/700 |
| 5,414,592 | 5/1995 | Stout et al. | 361/704 |
| 5,424,916 | 6/1995 | Martin | 361/698 |
| 5,440,450 | 8/1995 | Lau et al. | 361/695 |
| 5,457,342 | 10/1995 | Herbst, II | 257/712 |
| 5,461,878 | 10/1995 | Moore | 62/255 |
| 5,467,250 | 11/1995 | Howard et al. | 361/696 |
| 5,467,251 | 11/1995 | Katchmar | 361/719 |
| 5,473,508 | 12/1995 | Porter et al. | 361/695 |
| 5,473,511 | 12/1995 | Reddy et al. | 361/719 |
| 5,535,094 | 7/1996 | Nelson et al. | 361/697 |

*Primary Examiner*—Gerard P. Tolin
*Attorney, Agent, or Firm*—Charles E. Wands

[57] ABSTRACT

A sealed housing for cooling a plurality of printed circuit cards includes a chassis that supports a plurality of electrical connectors retaining printed circuit cards in mutually adjacent, spatially separated relationship. A first side of a respective printed circuit card is attached to an associated convectively cooled heat exchanger, having a cooling fluid flow chamber containing thermally conductive heat exchange elements through which an internal cooling fluid flows. A sealed, forced cooling fluid recirculation structure is mounted to the chassis and recirculates cooling fluid through heat exchangers of respective printed circuit cards. The sealed, internal cooling fluid recirculation structure contains thermally conductive heat exchangers that are convectively coupled with the internal cooling fluid and are conductively coupled to a distribution of thermally conductive fins on the outside of the chassis.

7 Claims, 6 Drawing Sheets

CLOSED LOOP COOLING HOUSING FOR PRINTED CIRCUIT CARD-MOUNTED, SEALED HEAT EXCHANGER

CROSS-REFERENCE TO RELATED APPLICATIONS

The present application is a continuation-in-part of application, Ser. No. 08/873,677, filed Jun. 12, 1997, entitled: "Printed Circuit Board-Mounted, Sealed Heat Exchanger," by C. Giannatto et al (hereinafter referred to as the '677 application), assigned to the assignee of the present application and the disclosure of which is herein incorporated.

FIELD OF THE INVENTION

The present invention relates in general to a housing and cooling enclosure for securely retaining and cooling a plurality of printed circuit cards in a sealed configuration. In particular, the housing and cooling enclosure of the invention provides for closed loop flow or recirculation of an internal cooling fluid through cooling fluid flow chambers of convective heat exchangers of respective printed circuit cards, and also through chassis supported heat exchangers that are conductively coupled to thermally conductive heat exchangers supported externally of the chassis.

BACKGROUND OF THE INVENTION

As described in the above-referenced '677 application, a variety of communication systems, particularly those installed in mobile (e.g., land-based) platforms, are designed to be environmentally robust in terms of their hardware and signaling format. As a non-limiting example, for the case of a terrestrial vehicle-mounted, communication system intended for use with a plurality of UHF line-of-sight and satellite links, a multi-link transceiver mounting rack may contain a plurality of diverse pieces of communication equipment, that typically include RF transmitter modules, RF receiver modules, and various digital signal processing modules, which control the operation of the RF components, and interface digital communications signals with attendant encryption and decryption processing circuits. Since each communication link has its own dedicated signalling scheme (modulation format, link protocol, band occupancy assignment, etc.), suppliers of such equipment will typically provide each system as an integrated unit.

One of the standard bus architectures employed for such systems is the VME bus. The VME bus architecture is comprised of a pair of multiple lead bus links, one of which has a predefined set of bus connection definitions, to which each module that may be plugged into the VME bus must conform, and a second of which, except for limited power rail assignments, has unspecified bus connection definitions, so that the user is free to customize the second bus link or connector interconnects to that bus link as desired.

Typically, RF signaling circuits and digital signaling modules plug into their own connector slots on the VME bus, in order to provide noise/cross-talk isolation between the RF and digital signal processing components of a given communication system architecture, and to conform with the relatively tight (center-to-center) dimensional spacings between connector slots on the VME bus. Signal connections between modules may be effected by cabling links between the modules and/or use one or more pins of module connectors for the second bus link portion of the VME bus, connection definitions for which would otherwise be unspecified for user customization.

Because VME-based communication system platforms can be expected to be employed in relatively harsh environments that expose the platforms to vibration, foreign matter and potentially damaging temperature variations, VME bus specifications mandate ruggedized housing architectures, that also cool the circuit components and effectively seal them from the external ambient. To accomplish these objectives it has been conventional practice to use very complex (and expensive) chassis-integrated heat transfer structures, on the one hand, and to use more thermally robust circuit components, per se, which undesirably add substantial bulk (and cost) to each circuit board, and thus to the overall housing assembly.

The printed circuit card support and cooling architecture described in the above-referenced '677 application is configured to remedy these shortcomings of conventional (VME) bus-mounted communication signal processing module configurations, by reducing the heat resistance paths to a thermal parameter window that allows the use of commercial grade circuit components. Also, the housing architecture has a smaller size than that of a conventional thermally controlled VME bus-based communication system architecture, facilitating installation of a VME bus-based signal processing system configuration in a relatively limited volume hardware platform.

For this purpose, as diagrammatically illustrated in FIG. 1, the housing structure of the '677 application employs a generally regular rectangular, metallic chassis 10 having first and second parallel sidewalls that adjoin parallel end walls 15 and 17, that are generally orthogonal to the sidewalls, and define a generally rectangular card-insertion cavity 21. The bottom of the chassis 10 is closed by a bottom cover 23, while its top is closed by a top cover 25.

The cavity 21 is bounded by a pair of slotted frames 27, which contain generally vertical, card-guide slots 29, that are sized to receive guide posts 31 mounted to opposite side edges 33 and 35 of respective printed circuit cards 40. At the bottom of the slotted frames 27 is a connector retention plate 37, supporting a parallel arrangement of spaced-apart, multi-pin electrical connectors 41. The multi-pin connectors receive associated dual in-line multi-pin connectors 43 attached to bottom edges 45 of the circuit cards, so that when installed in the chassis, the circuit cards are securely retained in mutually adjacent, spatially parallel relationship.

As shown in greater detail in the exploded views of FIGS. 2 and 3, and the top and front views of FIGS. 4 and 5, respectively, a generally frame-configured, thermally conductive (e.g., metallic), convection-based heat exchanger 50 is mounted to one side 53 of a respective printed circuit card 40. The heat exchanger serves to draw heat away from circuit components 42 on a second side 55 of the circuit card 40. Affixing the heat exchanger directly to the printed circuit card increases the flexure stiffness of the card. Also, mounting the circuit components and heat exchanger on opposite sides of the circuit card isolates the circuit components from the heat exchanger, preventing the circuit components from being exposed to any potentially corrosive foreign matter that may be present in the cooling fluid, which is typically external ambient air.

The heat exchanger includes a top wall 61, sidewalls 63 and 65, a bottom wall 67, and a back wall 68. These walls of a generally rectangular heat exchanger frame 60 form a cooling fluid flow chamber 70, that includes adjacent, generally rectangular cooling fluid flow chamber sections 71 and 73, which are ported by cooling fluid inlet and exhaust ports 81 and 83 formed within the top wall 61 of the heat exchanger frame. The frame 60 also has a center wall 69 that extends from the top wall 61 to a location 75 spaced apart from the bottom wall 67, so as to provide an intra chamber fluid communication port 85 connecting chamber sections 71 and 73. A cover plate 80 forms a front wall for the heat exchanger frame 60. The frame 60 and adjoining cover plate 80 are sized to conform with the printed circuit card 40, so that when the cover plate 80 is surface-joined with the first side 53 of the circuit card 40, the entirety of the card surface area upon which circuit components 42 are mounted is thermally coupled to the heat exchanger 50.

This direct face-to-face thermal coupling between the entirety of the first side 53 of the circuit card 40 with cover plate 80 reduces the length of the thermal resistance path between any circuit component 42 and the heat exchanger 50. Also the average temperature at any point on the printed circuit card 40 is uniformly the same, resulting in the lowest possible component temperatures for any given material set and cooling fluid conditions. As a consequence, components mounted to the second side 55 of printed circuit card 40 need not be mil-spec; instead, commercial circuit elements, which are considerably less costly, may be used.

The heat exchanger 50 further includes first and second thermally conductive, fin-shaped corrugated heat exchanger elements 91 and 93 retained in chamber sections 71 and 73 of the cooling fluid flow chamber 70. The fin-shaped heat exchanger elements 91 and 93 are sized to substantially fill chambers 71 and 73, but leave a fluid circulation region 79 between bottom edges 92 and 94 of elements 91 and 93, respectively, and the bottom wall 67 of the frame 60. This fluid circulation region 79 serves as a return path for cooling fluid that has entered the chamber 71 via inlet port 81 and has traveled (downwardly, as shown at arrows 96) through heat exchanger element 91.

Upon exiting the bottom of heat exchanger element 91 in chamber 71, the cooling fluid travels through the intra chamber fluid communication port 85 of region 79 and enters the bottom of heat exchanger element 93 in chamber 73. The cooling fluid then travels (upwardly as shown by arrows 98) through heat exchanger element 93 and exits through cooling fluid exhaust port 83. Advantageously, since each cooling fluid port 81 and 83 is located in a plane that is parallel to the circuit card 40, the effective thickness of the integrated heat exchanger—printed circuit board architecture of the '677 application allows the circuit card to be readily inserted into any of the connectors 41 of the chassis 10.

In order to supply and remove cooling fluid via the ports 81 and 83, a cooling fluid supply/exhaust plenum 100 is mounted to a top portion 12 of the chassis 10. The plenum 100 includes a cooling fluid supply chamber 101 and a cooling fluid removal chamber 103 that are in fluid communication with the chambers 71 and 73 of each thermally conductive heat exchanger 50 of a respective printed circuit card 40. The plenum 100 includes a generally rectangular frame 110 defined by a first sidewall 111, an end wall 113, a second sidewall 115, and a bottom wall 117, that generally enclose the pair of adjacent, generally rectangular chambers 101 and 103. Chamber 101 serves as a cooling fluid supply chamber and has a cooling fluid supply port 121 formed in a cover 120 that is attached to the top edges of the walls of frame 110. Complementarily, chamber 103 serves as a cooling fluid removal chamber and has a cooling fluid removal port 123 defined by a plenum opening 114 along a side portion 118 of the frame 110 coincident with an opening in the chassis 10.

The plenum frame 110 has a center wall 119 that extends from the first sidewall 111 to the second sidewall 115, so as to isolate the plenum chambers 101 and 103 from each other. Within the plenum chamber 101, the bottom wall 118 has a first set of generally elongated slots 131. Slots 131 are coincident with and adjoin the fluid inlet ports 81 of respective heat exchangers 50 of the circuit cards 40, when the cards are retained in their associated chassis guide slots. The floor portion of the plenum chamber 103 also has a second set of generally elongated slots 133, coincident with and adjoining the fluid exhaust ports 83 of the respective heat exchangers 50, when the cards are retained in their guide slots.

To seal the cooling fluid interfaces between slots 131 and 133 of plenum 100 and the fluid inlet and exhaust ports 81 and 83 of the heat exchangers 50, a multi-slotted gasket 140 is installed between the floor 118 of the plenum 100 and the top walls 61 of the heat exchanger frames 60. The gasket 140 has sets of generally elongated slots 141 and 143, that are coincident with and adjoin the elongated slots 131 and 133 of the plenum 110, and thereby the respective fluid inlet and exhaust ports 81 and 83 of the heat exchangers 50. What results is a cooling fluid path that is convectively coupled with each printed circuit card, yet is sealed off from their components, so that contaminants, which might be present in the cooling fluid (e.g., ambient air drawn in from the outside of the chassis), cannot come in contact with the printed circuit cards.

Now although the improved printed circuit card support and cooling architecture described in the above-referenced '677 application both cools the printed circuit cards, and protects their components in a sealed chassis, the cooling fluid flow path is directly ported to the external ambient environment. As a consequence, if the external air contains toxic foreign matter, not only is there no guarantee that a decontamination spray would completely cleanse the cooling flow path, but the very fact of introduction of such a solvent into the interior of the chassis is undesirable.

SUMMARY OF THE INVENTION

In accordance with the present invention, this potential problem is successfully addressed by a new and improved, closed loop housing and cooling enclosure, that provides for sealed isolation of a recirculating internal cooling fluid from the external environment, while still allowing the external ambient to thermally cool the internal cooling fluid, and thereby the components of the printed circuit cards installed within the housing.

For this purpose, like the housing and cooling architecture described above, the sealed, closed cooling loop housing structure of the present invention includes a chassis having a card-insertion cavity, into which convectively cooled printed circuit cards of the type described in the '677 application are inserted and retained in mutually adjacent, spatially separated relationship with one another. However, rather than employ a cooling fluid supply/exhaust plenum that is ported to the external ambient, the present invention uses a sealed, internal cooling fluid recirculation plenum structure that is configured to recirculate internal cooling fluid through fluid flow chambers of the heat exchangers of respective printed circuit cards. Additional heat exchangers are installed in cooling fluid flow chambers formed in sidewalls of the chassis. These additional heat exchangers are both convectively coupled with the recirculating cooling fluid and conductively coupled to thermally conductive, fins mounted on the external surface of the chassis.

As ambient air passes over the external fins, it draws away heat that has been conductively transferred from the additional heat exchangers installed in the cooling fluid flow chambers in the chassis' sidewalls, thereby conductively cooling the internal cooling fluid, as it recirculates within the chassis. In order to recirculate the cooling fluid, the sealed internal cooling fluid recirculation plenum structure includes a chassis-mounted fan arrangement that is operative to force the cooling fluid through the cooling fluid flow chambers of the heat exchangers of the circuit cards and also through the additional heat exchangers installed in the cooling fluid flow chambers of the sidewalls of the chassis.

DETAILED DESCRIPTION

The improved closed loop, sealed printed circuit card support and cooling architecture of the present invention is diagrammatically illustrated in FIGS. 6–11, as comprising a generally regular rectangular, six-sided, ruggedized metallic chassis 210 having first and second parallel sidewalls 211 and 213, which adjoin first and second parallel end walls 215 and 217, that are generally orthogonal to the chassis sidewalls, and define a generally rectangular printed circuit card-insertion cavity 221 therebetween.

Figure 1:
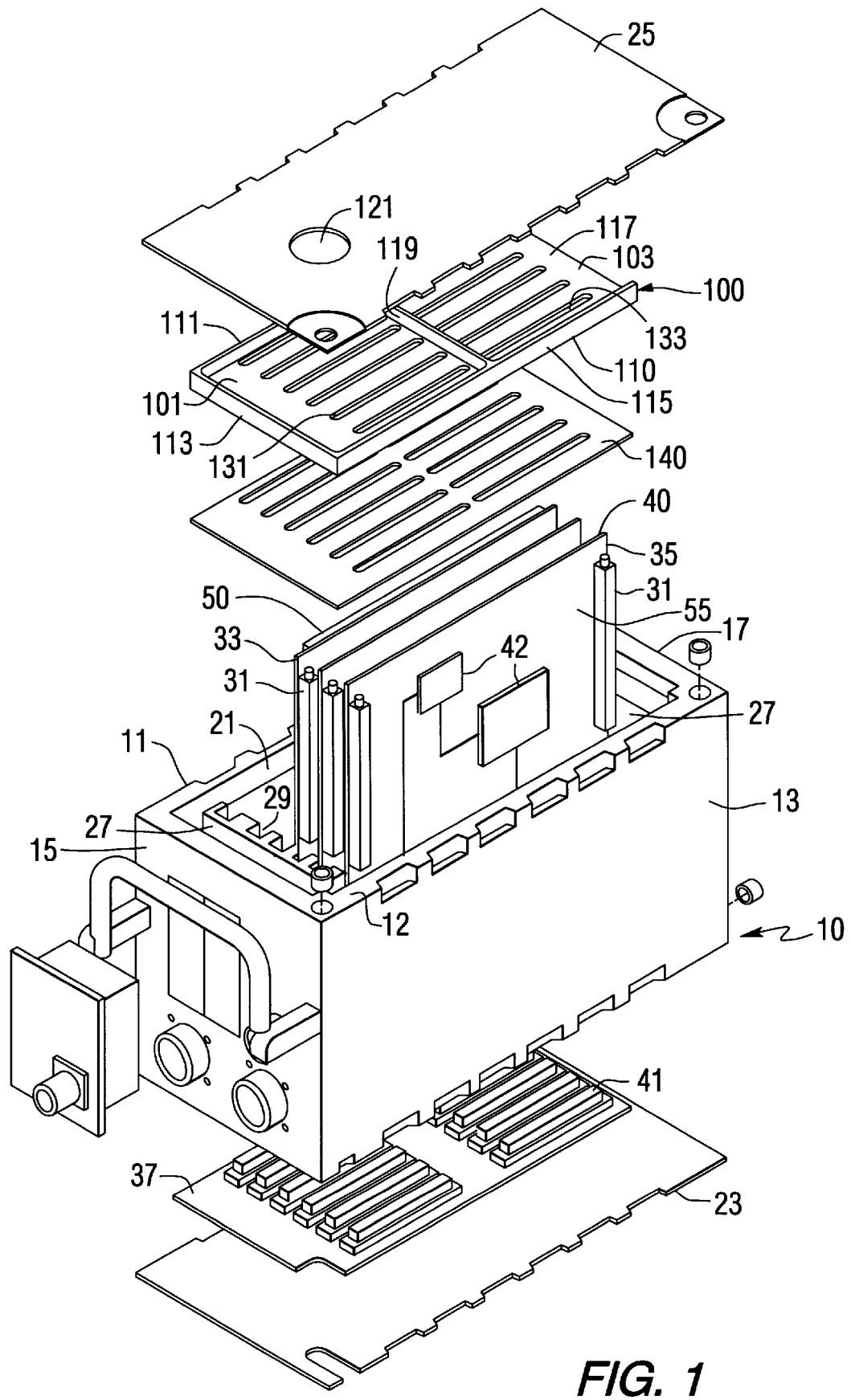
FIG. 1 is an exploded perspective view of a printed circuit card support and cooling structure described in the above-referenced '677 application.
Figure 2:
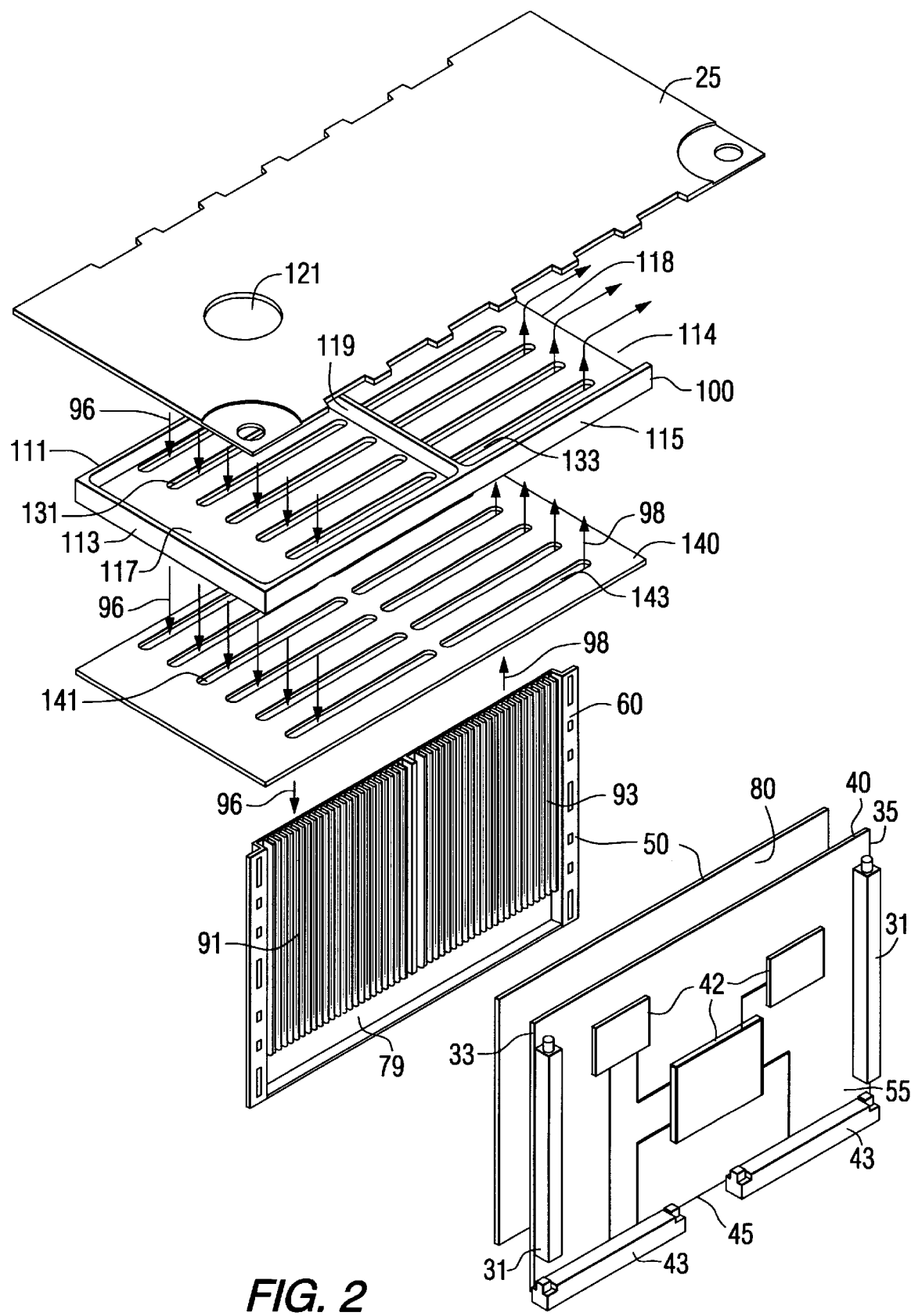
FIG. 2 is an exploded perspective view showing details of components of the structure of FIG. 1.
Figure 3:
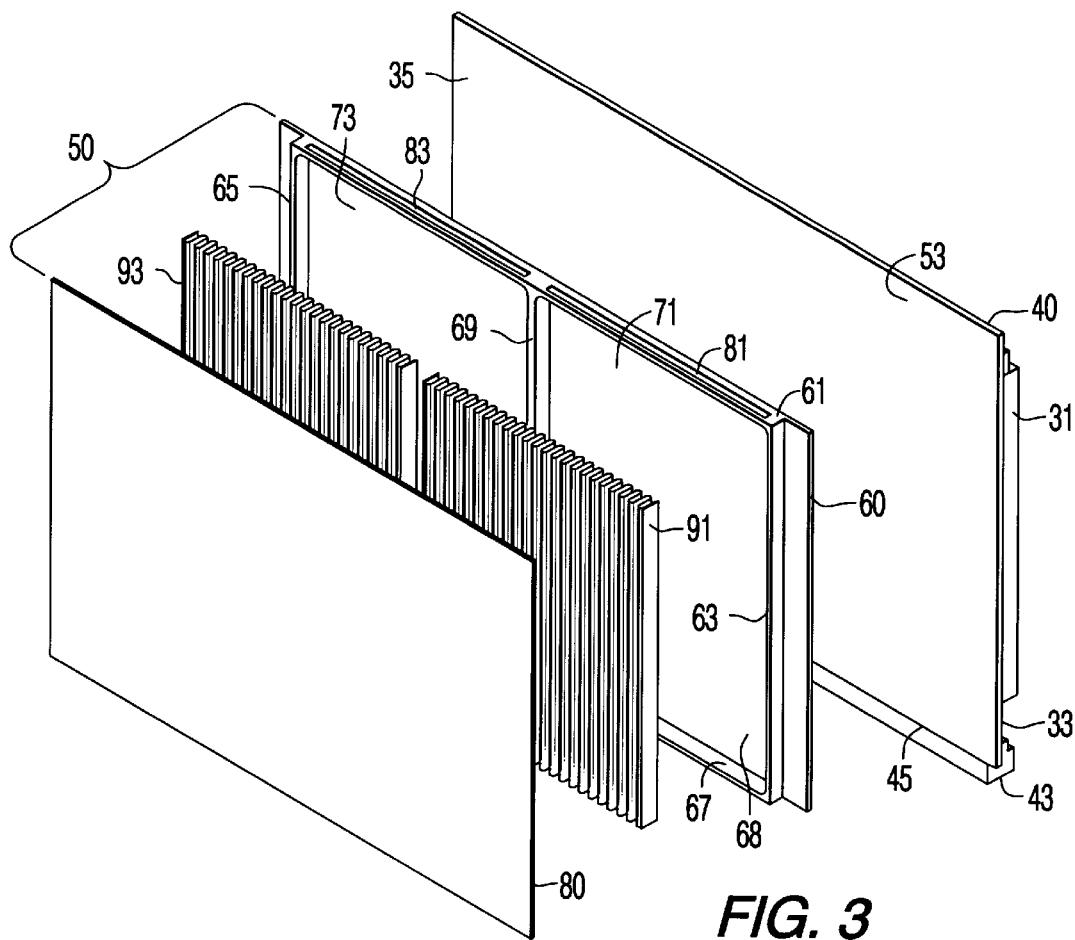
FIG. 3 is a reverse exploded perspective view of a printed circuit card and heat exchanger of FIGS. 1 and 2.
Figure 4:
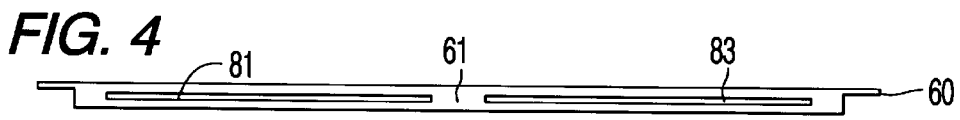
FIG. 4 is a top view of a heat exchanger frame.
Figure 5:
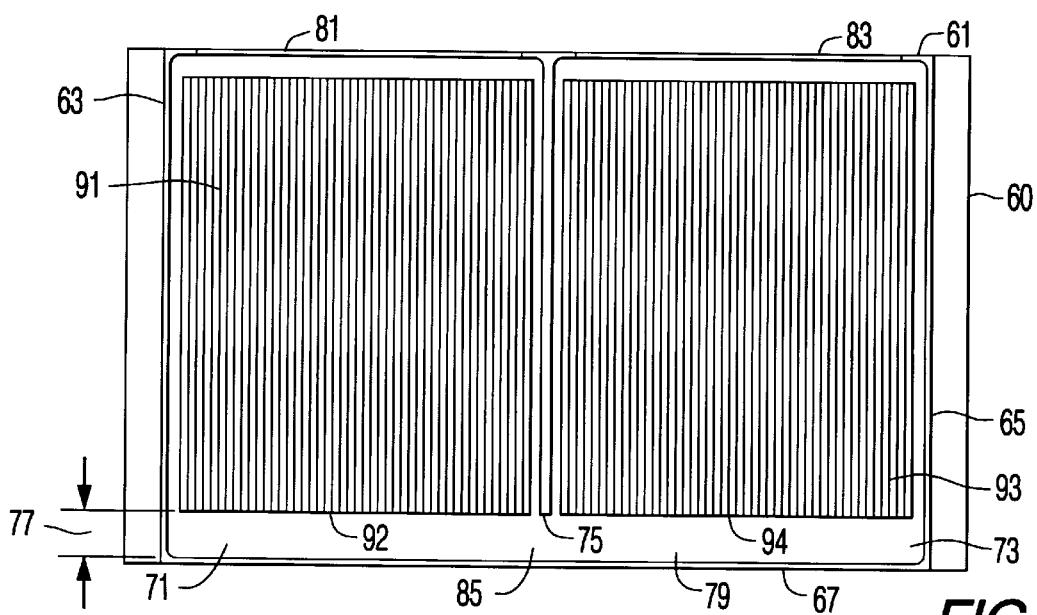
FIG. 5 is a front view of a heat exchanger frame, showing heat exchanger elements installed in cooling chambers of the frame.
Figure 6:
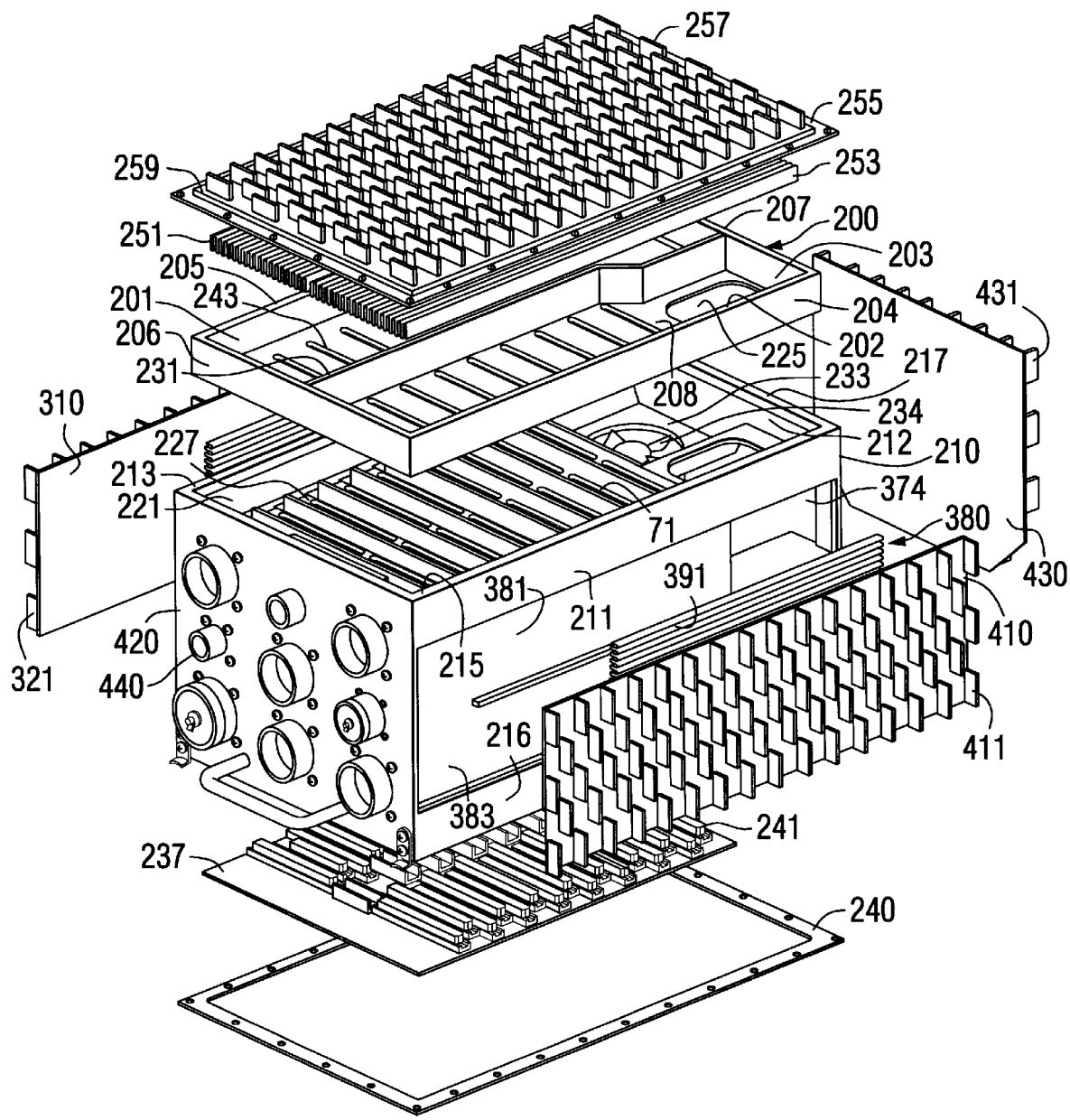
FIGS. 6 and 7 are respective front and rear exploded perspective views of a closed loop, printed circuit card support and cooling structure in accordance with the present invention.
Figure 7:
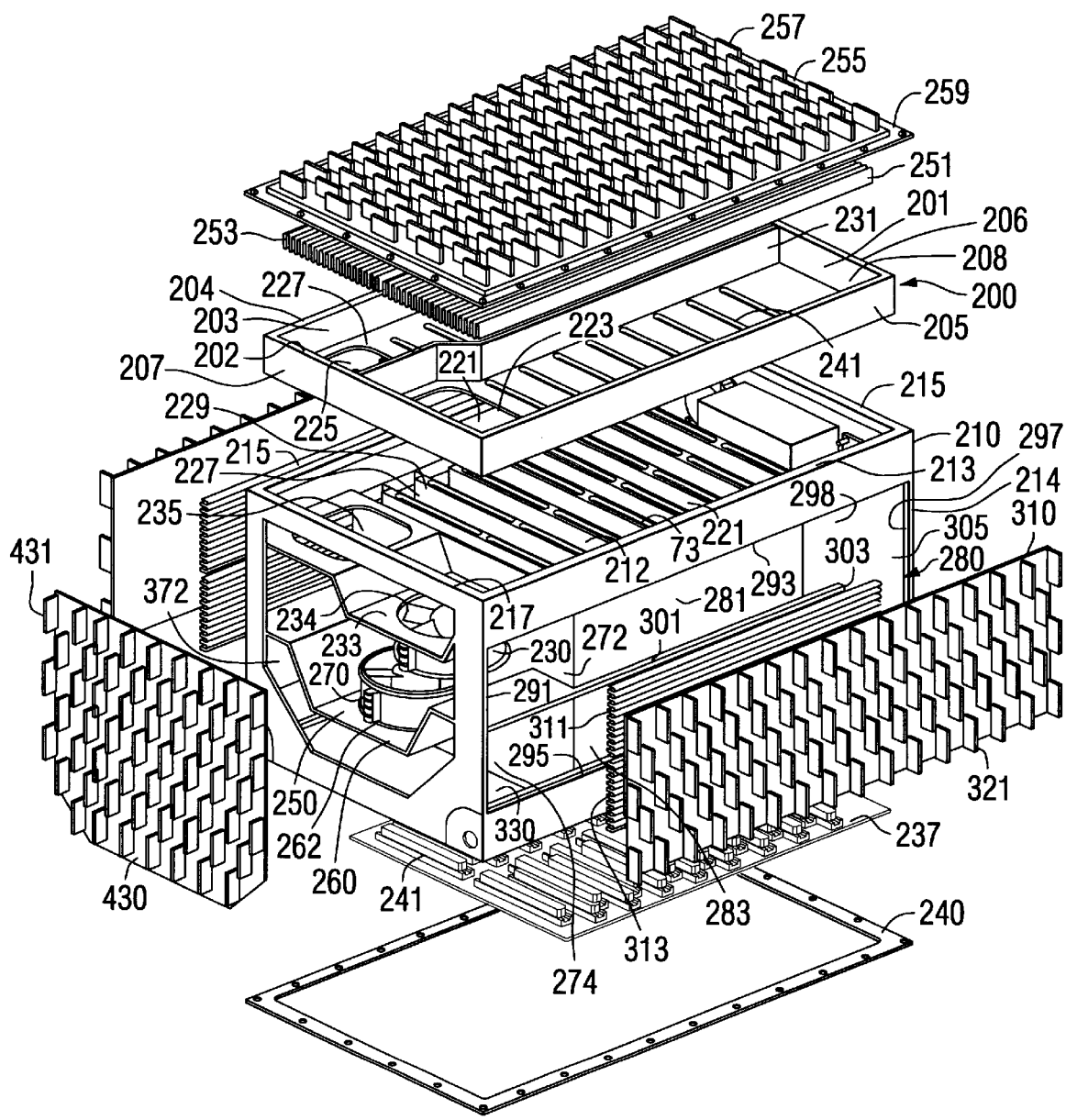
Figure 8:
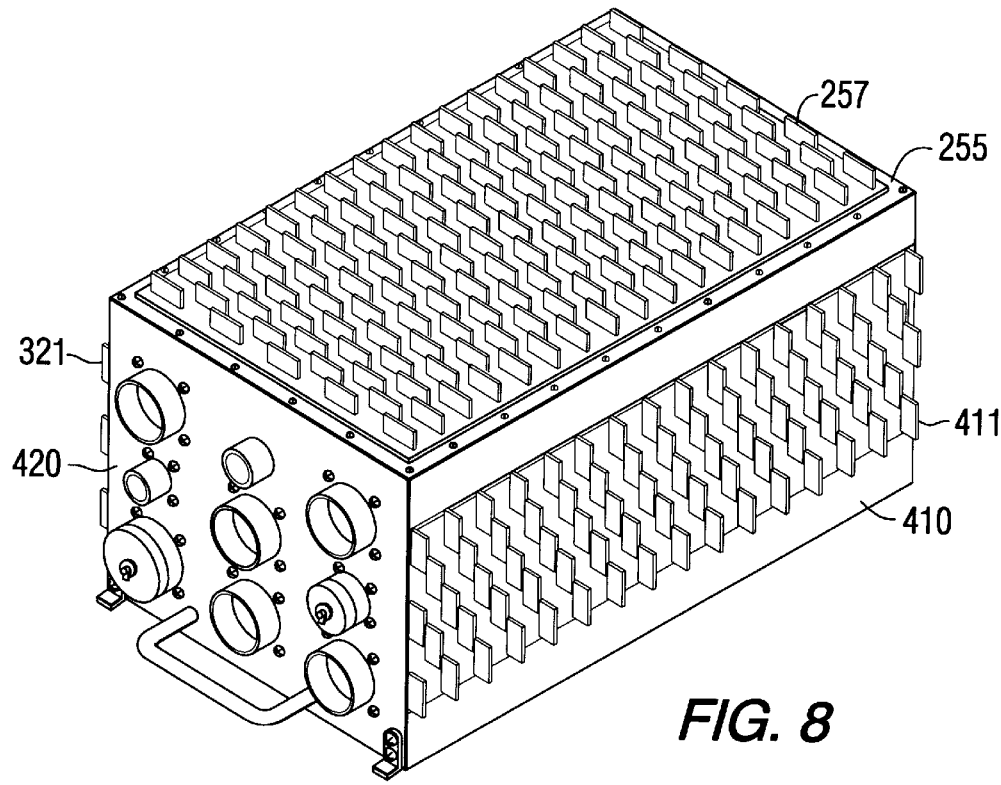
FIG. 8 is a front perspective view of the closed loop, printed circuit card support and cooling structure of FIGS. 6 and 7.
Figure 9:
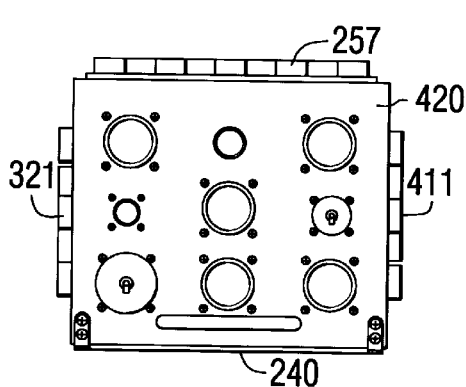
FIGS. 9, 10 and 11 are respective front, top and side views of the closed loop, printed circuit card support and cooling structure of FIGS. 6–8.
Figure 10:
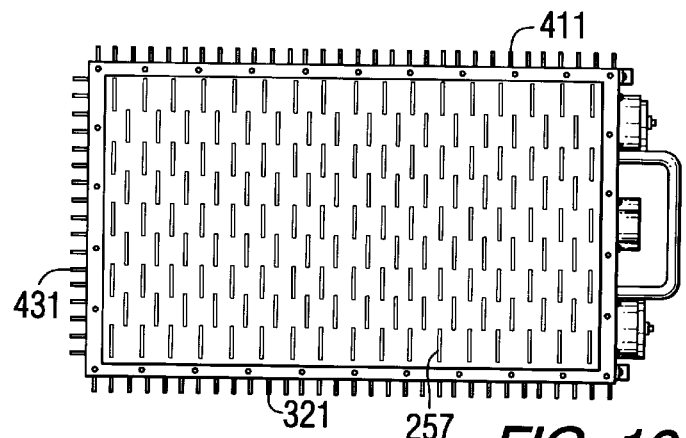
Figure 11:
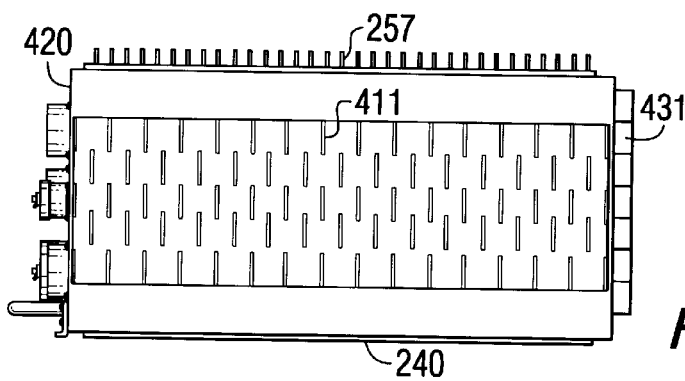

The card-insertion cavity 221 is bounded by a pair of mutually opposite slotted frames 227, which contain generally vertical, card-guide slots 229, that are sized to receive the guide posts 31 on opposite side edges 33 and 35 of respective convective heat exchanger-containing printed circuit cards 40, diagrammatically illustrated in FIGS. 3–5, described above. At the bottom of the slotted frames 227 is a connector retention plate 237, supporting a parallel arrangement of spaced-apart, multi-pin electrical connectors 241. A bottom cover 240 closes the bottom of the chassis 210 beneath the retention plate 237. The multi-pin connectors receive the dual in-line multi-pin connectors 43 attached to the bottom edges 45 of the circuit cards, so that, when installed in the chassis 210, the convective heat exchanger-containing circuit cards 40 are retained in mutually adjacent, spatially parallel relationship.

In order to supply and remove cooling fluid from each of the circuit cards' heat exchangers 50, an upper cooling fluid recirculation plenum 200 is installed immediately adjacent to a top portion of the chassis 210. The recirculation plenum 200 includes a cooling fluid injection chamber 201 and a cooling fluid removal chamber 203 that are in fluid communication with chambers 71 and 73 of each thermally conductive heat exchanger 50 of a respective printed circuit card 40. The upper cooling fluid recirculation plenum 200 has a generally rectangular frame configuration defined by first and second sidewalls 204 and 205, first and second end walls 206 and 207, and a floor or bottom wall 208, that encompass the chambers 201 and 203.

The cooling fluid injection chamber 201 has a cooling fluid inlet port 221 formed in a first region 223 of the floor 208; cooling fluid removal chamber 203 has a cooling fluid removal port 225 formed in a second region 227 of the floor 208, on the opposite side of a center wall 231 that extends between first and second end walls 206 and 207. The center wall 231 of the upper cooling fluid recirculation plenum 200 isolates the cooling fluid inlet and removal chambers 201 and 203 of the plenum 200 from each other.

The cooling fluid inlet port 221 is directly adjacent to a recessed tray 233 installed adjacent to an end portion of the plenum 200 beneath cooling fluid inlet port 221. The recessed tray 233 has an aperture 234 beneath which a first cooling fluid recirculation fan 230, within a fan support chamber 250, is mounted. In a similar manner, cooling fluid removal port 225 is located directly adjacent an opening 235 of an upper portion of the tray 233.

Within the cooling fluid inlet chamber 201, the bottom wall 208 has a first set of generally elongated slots 241, which are coincident with and adjoin the fluid inlet ports 81 of respective heat exchangers 50 of the circuit cards 40, when the cards are retained in their associated chassis guide slots. Also, the floor portion of the fluid removal chamber 203 has a second set of generally elongated slots 243, that are coincident with and adjoin the fluid exhaust ports 83 of the respective heat exchangers 50 of the circuit cards 40 as retained in their respective guide slots.

The fluid inlet chamber 201 of plenum 200 contains a first thermally conductive, corrugated heat exchanger element 251 that is sized to substantially fill the chamber 201. Similarly, the fluid removal chamber 201 of plenum 200 contains a second thermally conductive, corrugated heat exchanger element 253 that is sized to substantially fill chamber 203. A thermally conductive plenum cover 255, having a distribution of thermally conductive fins 257 projecting from its outer surface 259, is affixed to the top surface 202 of the plenum 200, sealing chambers 201 and 203 from the external environment, to which the thermally conductive fins 257 projecting from the plenum cover 255 are exposed.

Supported beneath and in fluid communication with the recessed tray 233 of the upper cooling fluid recirculation plenum 200 is a cooling fluid recirculation fan-supporting tray 260, having an aperture 262 over which a second fluid recirculation fan 270 is mounted. Tray 260 is separated from recessed tray 233, so as to form the chamber 250 having a first fluid flow return opening 272, which is ported to a first chamber section 281 of a first sidewall heat exchanger 280 affixed to a first side 214 of the chassis 210. In addition, the cooling fluid recirculation fan-supporting tray 260 is spaced apart from a bottom or floor 330 of the chassis 210, so as to form a first fluid flow inlet opening 274 that is ported to a second sidewall chamber section 283 of the first sidewall heat exchanger 280.

The separation between trays 260 and 233 also provides a second fluid flow inlet opening 374 to a first sidewall chamber section 381 of a second sidewall heat exchanger 380, which is mounted to a second side 216 of chassis 210 opposite to first side 214. Also, a second fluid flow return opening 372 is ported to a second sidewall chamber section 383 of the second sidewall heat exchanger 380.

Like the printed circuit card heat exchangers 50, the first sidewall heat exchanger 280 includes a first end wall 291, top and bottom walls 293 and 295, a second end wall 297, and a floor 298. The first sidewall heat exchanger 280 further includes a center wall 301 that extends from the first end wall 291 to a location 303 spaced apart from the second end wall 297, so as to provide an intra chamber fluid communication path 305 connecting first and second sidewall chamber sections 281 and 283, respectively. A first corrugated heat exchanger element 311 substantially fills the first sidewall chamber section 281, while a second thermally conductive, corrugated heat exchanger element 313 substantially fills the second sidewall chamber section 283.

A first, thermally conductive sidewall cover plate 310, having a distribution of thermally conductive heat exchanger fins 321 projecting from its outer surface is affixed to the first side 214 of the chassis 200, so as contact and thereby be in direct thermal communication with heat exchanger elements 311 and 313 of heat exchanger 280. In addition, the first sidewall cover plate 310 is sized so as to seal sidewall chamber sections 281 and 283 of the heat exchanger 280 from the external environment.

The second sidewall heat exchanger 380 has the same internal configuration as the first sidewall heat exchanger 280, including end walls, top and bottom walls, a floor, and a center wall that extends between the end walls, providing an intra chamber fluid communication path connecting the sidewall chamber sections 381 and 383. Also, respective corrugated heat exchanger elements, one of which is shown at 391, substantially fill the first and second sidewall chamber sections 381 and 383.

Like the first sidewall cover plate 310, a second, thermally conductive sidewall cover plate 410 is sized so as to cover the second side 216 of the chassis 210 and seal sidewall chamber sections 381 and 383 of the second sidewall heat exchanger from the external environment. The second sidewall cover plate 410 is in direct thermal contact with the heat exchanger elements 391 and 393, and has a distribution of thermally conductive heat exchanger fins 411 projecting from its outer surface.

To complete the closed loop housing architecture of the present invention, a front end of the chassis 210 at end wall 215 is formed as an end panel 420, that is fitted with various connectors and control elements 440, as shown. A rear end of the chassis at end wall 217 is closed by a back cover plate 430. Like the sidewall cover plates, 310 and 410, back cover plate 430 as a distribution of thermally conductive heat exchanger fins 431 projecting from its outer surface, to facilitate further cooling of the internal cooling fluid, as it is recirculated through the interior of the chassis.

In operation, during recirculation of the cooling fluid (air) through the respective plenum and sidewall heat exchangers, described above, the thermal energy of the cooling fluid is effectively transferred to the external ambient (outside air) by the thermally conductive fins of the thermally plenum cover 255, sidewall cover plates 310 and 410, and back cover plate 430. As ambient air passes over these and other external fins of the housing, it draws away heat that has been conductively transferred from heat exchangers in the cooling fluid flow chambers, thereby conductively cooling the internal fan-forced cooling fluid, as it recirculates within the chassis.

Maintaining the recirculating internal cooling fluid in sealed, thermal communication with the external environment allows the outside ambient to thermally cool the cooling fluid, and thereby the components of the printed circuit cards installed within the housing, on the one hand, and also effectively seals the cooling fluid from the external ambient environment, which not only prevents entry of foreign matter, but allows the chassis to be subjected to a decontamination, cleansing spray.

More particularly, as the first recirculation fan 230 forces internal cooling fluid (air) upwardly into the cooling fluid inlet chamber 201 of upper plenum 200, the cooling fluid passes through its corrugated heat exchangers 251, which are thermally conductively coupled to the external fins 257 on the plenum cover plate 255, so that the cooling fluid is cooled thereby. Because chamber 201 is closed off by the plenum's center wall 231, the cooling air is forced downwardly through slots 241 of the plenum floor 208 and through the respective heat exchangers 50 of the printed circuit cards, removing thermal energy imparted by the circuit cards' corrugated heat exchangers.

After circulating through the cards' heat exchangers, the cooling fluid, now having a raised thermal energy, is returned via slots 243 into the upper plenum's cooling fluid removal chamber 203, and travels over its corrugated heat exchangers 253. As it passes through these heat exchangers, the cooling fluid is cooled, and is then directed downwardly through cooling fluid removal port 225, whereupon the cooling fluid is circulated through and cooled by the second sidewall heat exchanger 380.

Upon exiting the second fluid flow return opening 372 of the second sidewall heat exchanger 380, the cooling fluid enters the fan support chamber 250, and is then forced downwardly by fan 270 and through the first fluid flow inlet opening 274 into the first sidewall heat exchanger 380. After the cooling fluid has been circulated through and further cooled by the second sidewall heat exchanger 280, it is returned through the first fluid return opening 272, thereby completing a full recirculation cycle, and once again forced by recirculation fan 230 upwardly into the cooling fluid inlet chamber 201 of upper plenum 200, as described above.

Thus, it can be seen that the closed loop, printed circuit card housing and cooling enclosure of the present invention not only efficiently cools components of the printed circuit cards, while providing sealed isolation of the recirculated internal cooling fluid from the external environment, but allows the external ambient to thermally cool the internal cooling fluid. Sealing the internal cooling fluid from the external ambient prevents entry of foreign matter, while allowing the chassis to be subjected to a decontamination, cleansing spray. As described above, as ambient air passes over the external fins, it draws away heat that has been conductively transferred from heat exchangers in the cooling fluid flow chambers in the chassis' sidewalls, thereby conductively cooling the internal fan-forced cooling fluid, as it recirculates within the chassis.

While we have shown and described an embodiment in accordance with the present invention, it is to be understood that the same is not limited thereto but is susceptible to numerous changes and modifications as are known to a person skilled in the art, and we therefore do not wish to be limited to the details shown and described herein, but intend to cover all such changes and modifications as are obvious to one of ordinary skill in the art.

What is claimed:

1. A sealed housing enclosure for securely retaining and cooling a plurality of printed circuit boards comprising:

a chassis having a cavity between sidewalls that contain a plurality of card-guide slots, and receive and guide edges of said printed circuit boards for insertion into electrical connectors at a first portion of said chassis, so that said printed circuit boards are retained in said chassis;

an internal cooling fluid supply/exhaust plenum at a second portion of said chassis spaced apart from said first portion thereof by said cavity therebetween, and including an internal cooling fluid supply chamber, to which an internal cooling fluid for cooling circuit components of said printed circuit boards is supplied, said internal cooling fluid supply chamber having a plurality of internal cooling fluid supply slots, and an internal cooling fluid exhaust chamber adjacent to said internal cooling fluid supply chamber and from which said internal cooling fluid having cooled said circuit components of said printed circuit boards is removed, said internal cooling fluid exhaust chamber having a plurality of internal cooling fluid removal slots adjacent to said plurality of internal cooling fluid supply slots;

a plurality of first thermally conductive heat exchangers, a respective first thermally conductive heat exchanger of said plurality of first thermally conductive heat exchangers being in thermally conductive engagement with a first side of a respective printed circuit board of said plurality of circuit boards, so as to draw heat away from and thereby cool said circuit components mounted to a second side of said respective printed circuit board, and includes an internal cooling fluid inlet port at a first side of said first thermally conductive heat exchanger, and being joined in sealing engagement with a respective internal cooling fluid supply slot of said plurality of internal cooling fluid supply slots of said internal cooling fluid supply chamber of said internal cooling fluid supply/exhaust plenum, and through which said internal cooling fluid is introduced from said internal cooling fluid supply/exhaust plenum, and an internal cooling fluid outlet port adjacent to said internal cooling fluid inlet port at said first side of said first thermally conductive heat exchanger, and joined in sealing engagement with a respective internal cooling fluid removal slot of said plurality of internal cooling fluid removal slots of said internal cooling fluid exhaust chamber of said internal cooling fluid supply/exhaust plenum, and through which said internal cooling fluid is exhausted from said first thermally conductive heat exchanger into said internal cooling fluid supply/ exhaust plenum;

a plurality of second thermally conductive heat exchangers mounted externally of said chassis and over which an external cooling fluid external of said housing passes; and a sealed, internal cooling fluid recirculation structure coupled with said internal cooling fluid supply/exhaust plenum, and containing third thermally conductive heat exchangers that are convectively coupled with said internal cooling fluid and are conductively coupled to said second thermally conductive heat exchangers supported externally of said chassis, said sealed, internal cooling fluid recirculation structure recirculating said internal cooling fluid through said internal cooling fluid supply/exhaust plenum, and thereby through said internal cooling fluid flow chambers of said first thermally conductive heat exchangers of said printed circuit cards, so that said internal cooling fluid is cooled by said second thermally conductive heat exchangers supported externally of said chassis.

2. A sealed housing enclosure according to claim 1, wherein said sealed, internal cooling fluid recirculation structure includes a fan arrangement that is operative to force said internal cooling fluid through said internal cooling fluid supply/exhaust plenum, and thereby through said internal cooling fluid flow chambers of said first thermally conductive heat exchangers of said printed circuit cards and in an internal cooling fluid flow path with said third thermally conductive heat exchangers that are conductively coupled to said second thermally conductive heat exchangers.

3. A sealed housing structure according to claim 2, wherein said internal cooling fluid supply/exhaust plenum is mounted at a top portion of said chassis, and wherein said sealed, internal cooling fluid recirculation structure includes sidewall chambers, which contain fourth thermal heat exchangers therein coupled in fluid communication with said internal cooling fluid supply/exhaust plenum, and are thermally coupled with external sidewall heat exchangers at sidewalls of said chassis.

4. A sealed housing enclosure according to claim 3, further including an end panel and a back cover adjacent to said fan arrangement, said back cover including a distribution of additional thermally conductive heat exchangers projecting from an outer surface thereof, and facilitating cooling of said internal cooling fluid as said internal cooling fluid is recirculated by said fan arrangement.

5. A sealed housing enclosure according to claim 1, wherein said respective first thermally conductive heat exchanger further includes a frame having a first end wall adjoining said fluid supply/exhaust plenum and containing said internal cooling fluid inlet port and said internal cooling fluid outlet port, side walls parallel with side edges of said printed circuit cards, a second end wall opposite to said first end wall, and a back wall, that enclose first and second adjacent internal cooling fluid flow chambers, and a further wall that extends from said first end wall to a location spaced apart from said second end wall, so as to provide an intra chamber fluid communication port connecting said first and second internal cooling fluid flow chambers, and a heat exchanger cover plate, and wherein said heat exchanger further includes first and second thermally conductive heat exchange elements, respectively retained in and substantially filling said first and second internal cooling fluid flow chambers, but leaving a fluid circulation region therein that provides a fluid flow loop path for internal cooling fluid that has entered said first chamber via said internal cooling fluid inlet port in said first end wall of said frame, and has traveled through said first heat exchange element and, upon exiting said first heat exchange element, travels through said fluid circulation region and said second heat exchange element in said second chamber, exiting through said internal cooling fluid exhaust port in said first end wall of said frame.

6. A sealed housing enclosure according to claim 1, further including gasket material that seals interfaces between said internal cooling fluid supply and removal slots of said supply/exhaust plenum and said internal cooling fluid inlet and exhaust ports, respectively, of said first thermally conductive heat exchangers.

7. A sealed housing enclosure according to claim 1, wherein said internal fluid supply/exhaust plenum includes convective heat exchangers that are thermally coupled to further heat exchanger elements on the external surface of said chassis.

* * * * *